US008545639B2

(12) United States Patent
Shih et al.

(10) Patent No.: US 8,545,639 B2
(45) Date of Patent: Oct. 1, 2013

(54) METHOD OF CLEANING ALUMINUM PLASMA CHAMBER PARTS

(75) Inventors: Hong Shih, Santa Clara, CA (US); John Daugherty, Fremont, CA (US); Dean J. Larson, Fremont, CA (US); Tuochuan Huang, Saratoga, CA (US); Armen Avoyan, Glendale, CA (US); Jeremy Chang, Sunnyvale, CA (US); Sivakami Ramanathan, Fremont, CA (US); Robert Anderson, Newark, CA (US); Yan Fang, Fremont, CA (US); Duane Outka, Fremont, CA (US); Paul Mulgrew, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 35 days.

(21) Appl. No.: 13/285,203

(22) Filed: Oct. 31, 2011

(65) Prior Publication Data

US 2013/0104930 A1    May 2, 2013

(51) Int. Cl.
C23G 1/00 (2006.01)
C23G 1/02 (2006.01)
B08B 3/00 (2006.01)

(52) U.S. Cl.
USPC ........... 134/28; 134/2; 134/3; 134/26; 134/29

(58) Field of Classification Search
None
See application file for complete search history.

(56) References Cited

U.S. PATENT DOCUMENTS

| 3,961,111 | A * | 6/1976 | Smith ........................ 427/419.2 |
| 5,225,034 | A | 7/1993 | Yu et al. |
| 6,376,385 | B2 | 4/2002 | Lilleland et al. |
| 6,394,107 | B1 * | 5/2002 | Kesari et al. ................. 134/22.1 |
| 7,329,561 | B2 | 2/2008 | Symanczyk et al. |
| 7,645,341 | B2 | 1/2010 | Kennedy et al. |
| 7,833,904 | B2 | 11/2010 | Tang et al. |
| 2003/0201538 | A1 * | 10/2003 | Lee et al. ....................... 257/751 |
| 2006/0141802 | A1 * | 6/2006 | Shih et al. ..................... 438/753 |
| 2008/0015132 | A1 * | 1/2008 | Ren et al. ....................... 510/175 |
| 2008/0241517 | A1 * | 10/2008 | Kenworthy et al. ........... 428/332 |
| 2009/0056745 | A1 * | 3/2009 | Sun et al. ............................. 134/3 |
| 2009/0325320 | A1 * | 12/2009 | Avoyan et al. ..................... 438/4 |
| 2010/0003824 | A1 | 1/2010 | Kadkhodayan et al. |
| 2010/0003829 | A1 * | 1/2010 | Patrick et al. ................. 438/758 |

FOREIGN PATENT DOCUMENTS

| JP | 7-066180 A | 3/1995 |
| JP | 2001-176846 A | 6/2001 |

OTHER PUBLICATIONS

Huang, Yuelong et al. "Evaluation of the corrosion resistance of anodized aluminum 6061 using electrochemical impedance spectroscopy (EIS)", Corrosion Science 50 (2008), pp. 3569-3575.

Huang, Yuelong et al. "Evaluation of the properties of anodized aluminum 6061 subjected to thermal cycling treatment using electrochemical impedance spectroscopy (EIS)", Corrosion Science 51 (2009), pp. 2493-2501.

* cited by examiner

Primary Examiner — Nicole Blan
(74) Attorney, Agent, or Firm — Buchanan Ingersoll & Rooney PC

(57) ABSTRACT

A method of cleaning a surface of a component of a plasma chamber, wherein the component has an aluminum or anodized aluminum surface, the method including the steps of: soaking the surface of the component in a diluted sulfuric peroxide (DSP) solution; spray rinsing the surface with water following removal of the surface from the DSP solution; soaking the surface in a dilute nitric acid ($HNO_3$) solution; spray rinsing the surface with water following removal of the surface from the dilute nitric acid solution; and repeating at least twice the steps of soaking the surface in dilute nitric acid followed by spray rinsing the surface.

19 Claims, No Drawings

METHOD OF CLEANING ALUMINUM PLASMA CHAMBER PARTS

BACKGROUND

Aluminum alloys and anodized aluminum due to their unique properties and low cost have been widely applied as plasma etch chamber part coatings, stripping chambers, and process kits since the 1980s. In addition, it is anticipated that they will continue to serve either as plasma etching chamber coatings or stripping chambers in the future.

With the etching feature size shrinkage up to 45 nm, 32 nm, and even 25 nm as well as new etching applications, the decontamination and surface cleanliness of aluminum and anodized aluminum have become an important factor for achieving a high production yield in silicon wafer fabrication. Therefore, it would desirable to have an enhanced precision wet cleaning on both aluminum and anodized aluminum in order to achieve zero particles, low transition metal contamination and mobile ion levels such as Na (sodium) and K (potassium) without causing the corrosion of bare and/or underlying aluminum and the degradation of the unique property of anodized aluminum.

The existing precision wet cleaning procedures of bare aluminum and anodized aluminum including the on-line and off-line precision wet cleaning procedures have been performed for many years in the semiconductor industry. However, the relatively high metal contamination levels on bare aluminum and the anodized aluminum surfaces, which did not attract technical attention in the past, has been shown to cause productivity issues on etch tools. Every supplier generally has its own wet cleaning method to clean bare aluminum and anodized aluminum. In most cases, the surface cleanliness is poor and inconsistent. In addition, suppliers have no methodology to evaluate the chemical compatibility of bare aluminum and anodized aluminum after exposure to different chemicals. The quantitative data to support surface cleanliness after cleaning is also not available.

A number of issues exist including that the wet cleaning suppliers in the world lack facilities and techniques to carry on the characterization of anodized aluminum before and after precision wet cleaning. For example, at this time, it is believed that only the United States and Japan have the facilities to perform these studies. Furthermore, previous wet cleaning methods or procedures of bare aluminum and anodized aluminum cannot provide a consistent surface cleanliness on both bare aluminum and anodized aluminum. For etching of small feature sizes and new etch applications, the previously existing cleaning methods provide high levels of mobile ions and transition metals on bare aluminum and anodized aluminum. Therefore, the production yield may be impacted by high metal contamination levels.

Furthermore, manufacturers that are working on small etching feature sizes and new etch applications usually face the challenges of high levels of Na and K, as well as other transition metals on the production wafers. A high level of metal contamination on the aluminum and anodized aluminum chamber parts can cause production yield losses unless the metal contamination is removed.

Accordingly, it would be desirable to have a system and method of cleaning a component of a plasma chamber, wherein the component has an aluminum or anodized aluminum surface, which address the problems mentioned above.

SUMMARY

In accordance with an exemplary embodiment, a method of cleaning an aluminum or anodized aluminum surface of a component of a plasma chamber comprises the steps of: soaking the surface in a diluted sulfuric peroxide (DSP) solution; spray rinsing the surface with water following removal of the surface from the DSP solution; soaking the surface in a dilute nitric acid ($HNO_3$) solution; spray rinsing the surface with water following removal of the surface from the nitric acid solution; and repeating at least twice the steps of soaking the surface in dilute nitric acid followed by spray rinsing the surface.

In accordance with another exemplary embodiment, a method of improving corrosion resistance of an anodized aluminum surface on a component of a plasma chamber comprises the steps of: removing the component from the plasma chamber after plasma processing semiconductor substrates in the chamber; performing a wet cleaning process on the anodized surface; and performing a hot deionized water (DIW) seal on the anodized surface following the wet cleaning process.

DETAILED DESCRIPTION

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps in a plasma reaction chamber (or plasma chamber), which form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, HBr, $Cl_2$, and $SF_6$ or mixtures thereof with $O_2$, $N_2$, He or Ar is introduced into the etching chamber and maintained at a pressure which is typically in the millitorr range. The upper electrode is a showerhead electrode provided with gas outlet(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls.

As disclosed in commonly owned U.S. Pat. No. 6,376,385, which is incorporated herein by reference in its entirety, an electrode assembly for a plasma reaction chamber, wherein processing of a semiconductor substrate, such as a single wafer, can be carried out, can include a backing member or ring, an electrode, such as a silicon showerhead electrode in the form of a circular disk, and an elastomeric joint between the backing member and the electrode. The backing member or ring can be made of graphite, aluminum (including aluminum and aluminum alloys, e.g., 6061 Al), and/or silicon carbide. However, the electrode plate can be removably attached to an aluminum backing plate with mechanical fasteners such as cam locks as disclosed in commonly owned U.S. Published Application Nos. 2010/0003824 and 2010/0003829. Aluminum backing plates can have a bare aluminum outer surface (i.e., a native oxide outer surface), or an anodized outer surface formed over all or only portions of the outer surface (i.e., anodized aluminum). Anodized aluminum includes an underlying or bare aluminum surface with an anodized film of a thin barrier layer of relatively non-porous aluminum oxide and thick porous layer of aluminum oxide.

Additionally, an electrode assembly may comprise an outer electrode ring or member surrounding an inner electrode and optionally separated therefrom by a ring of dielectric material. The outer electrode member is useful for extending a single crystal silicon electrode to process larger wafers, such as 300 mm wafers. Similar to the inner electrode, the outer electrode member is preferably provided with a backing member, e.g., the outer ring may comprise an electrically grounded ring to which the outer electrode member may be elastomer bonded. The backing member of the inner electrode and/or outer electrode member may have mounting holes for mounting in a capacitively coupled plasma-processing tool. Both the inner electrode and outer electrode member are preferably comprised of single crystal silicon, in order to minimize electrode assembly contaminants. The outer electrode member may be comprised of a number of segments (e.g., six segments) of single crystal silicon, arranged in an annular configuration, each of the segments being bonded (e.g., elastomer bonded) to a backing member. Further, adjacent segments in the annular configuration may be overlapping, with gaps or joints between the adjacent segments.

As set forth above, components within the plasma chambers can have an aluminum outer surface or an anodized aluminum outer surface formed over all or only portions of the outer surface of the components. An example of an aluminum and/or anodized aluminum component is an aluminum backing plate of a silicon showerhead electrode assembly of a capacitively coupled plasma chamber. Other examples of components having aluminum or anodized aluminum surfaces include a baffle plate of a showerhead electrode assembly, a baffle ring, a liner, a chamber wall, and/or a gas distribution plate in a capacitively or inductively coupled plasma chamber. The methods as described herein can be used with any aluminum or anodized aluminum component and/or part of a plasma chamber with an exposed surface and/or possibly plasma-exposed surface.

In accordance with an exemplary embodiment, a method of cleaning an aluminum or anodized aluminum surface of a component of a plasma chamber, wherein the component has an exposed aluminum or anodized surface is disclosed herein. The method includes the steps of: soaking the surface in a diluted sulfuric peroxide (DSP) solution; spray rinsing the surface with water following removal of the component from the DSP solution; soaking the surface in a dilute nitric acid ($HNO_3$) solution; spray rinsing the surface with water following removal of the surface from the nitric acid solution; and repeating at least twice the steps of soaking the surface in dilute nitric acid followed by spray rinsing the surface.

In accordance with an exemplary embodiment, the methods as described herein are based on a selection of chemical solutions, which can effectively clean both bare aluminum and anodized aluminum, and which potentially has no impact to the unique properties of anodized aluminum. The method and system as described herein considers some of the key parameters of the unique properties of anodized aluminum and the chemical compatibility of anodized aluminum before and after the additional chemical treatments are performed. In addition, systematic ICPMS (inductively coupled plasma mass spectrometry) analysis on both anodized aluminum and bare aluminum surfaces before and after the precision wet cleaning was performed to support the findings herein.

In accordance with an exemplary embodiment, the methods as described herein reduce metal contamination levels from aluminum and anodized aluminum surfaces in order to meet requirements for 45 nm, 32 nm or even smaller etching feature sizes, which has become critical for both dielectric and conductive plasma etch applications. The reduction of mobile ions such as Na and K is a difficult task in the precision wet cleaning of bare aluminum and anodized aluminum.

The reduction of Na and K levels as well as other transition metal levels from both bare aluminum and the anodized aluminum surfaces is difficult due to the nature of the aluminum alloy itself as well as the limitations on the number of chemicals, which can be used to clean anodized aluminum without causing any damage. For example, high levels of Na and K are often observed on anodized aluminum parts with complex features. One cannot treat anodized aluminum in a relatively high temperature (i.e., at 130° C. or higher) because the high temperature causes cracks in the anodic film, which reduces the corrosion resistances of the anodized aluminum dramatically. Furthermore, aggressive chemicals cannot be used to clean anodized aluminum because the chemical solutions attack the anodized aluminum and cause degradation of the anodic film. Thus, most soft cleaning methods are time-consuming, not effective, and have a relatively high cost in cleaning and materials consumption such as DIW (deionized water), wipes, and solvents, and the metal contamination levels are not consistent after soft cleaning.

For many years, a mixed $NH_4OH$ (ammonium hydroxide) and $H_2O_2$ (hydrogen peroxide) solution and a dilute acetic acid solution have been used to clean anodized aluminum components. These solutions are generally soft and do not cause severe damage to anodized aluminum. However, the use of these solutions has shown a limited impact on the degradation of the corrosion resistance of anodized aluminum. In fact, both solutions have been used for the on-line cleaning of the anodized aluminum chamber. However, it has been seen that dilute acetic acid can form complex ions with some metal ions and has no impact to the corrosion resistance of anodized aluminum. Meanwhile, $H_2O_2$ can react with metals to form metal ions, and $NH_4OH$ can react with metal ions to form complex ions. Due to the strong oxidation nature of $H_2O_2$, pitting corrosion may occur on bare aluminum after exposure to $H_2O_2$ solution for a relatively long time such as 30 minutes or longer, where the atomic oxygen reacts with the aluminum alloy and pitting corrosion can occur. A mixed $NH_4OH$ and $H_2O_2$ solution can also cause stains on anodized aluminum surfaces after exposure for 30 minutes or longer. The stains can typically be removed using Scotch-Brite™ and DIW (deionized water).

The surface cleanliness of a mixed $NH_4OH$ and $H_2O_2$ solution and a dilute acetic acid solution on anodized aluminum has certain limitations, particularly, on the removal of levels of Na and K. These solutions also have limitations on removal of some mobile metals such as Cu, Fe, Co, Zn, Ti, Mo, Ni, W, and Cr. In order to improve the surface cleanliness on bare aluminum and anodized aluminum, the strong oxidation potential of the solutions needs to be considered. For example, a dilute DSP containing $H_2SO_4$ and $H_2O_2$ is effective to remove polymers as well as metals. A dilute $HNO_3$ acid (nitric acid) can also remove most metals, particularly, Cu, Fe, Co, Zn, Ti, Ni, et al. Meanwhile, concentrated $HNO_3$ at 40 wt % (weight percentage) can be used to check anodization DIW sealing quality as a standard procedure. For example, a 40 wt % $HNO_3$ solution can be dropped on an anodized aluminum surface for 5 minutes and then the area can be cleaned by DIW. If there is a color change, the quality of DIW seal is often poor. Furthermore, for high quality anodized aluminum with a good DIW seal, one cannot observe the color change after the attack of 40 wt % $HNO_3$ for 5 minutes.

In accordance with an exemplary embodiment, it would be desirable to use a chemical solution such as a dilute DSP (diluted sulfuric peroxide) and a dilute $HNO_3$ acid solution to provide an effective solution for the cleaning of a used component of a plasma chamber having an aluminum and/or an anodized aluminum surface. In accordance with an exemplary embodiment, the cleaning solution preferably includes a dilute DSP mixed aqueous solution, which contains about 5.0 vol % of a 98 wt % $H_2SO_4$ aqueous solution, 5.0 vol % of a 30% $H_2O_2$ aqueous solution, and 90 vol % UPW (ultra pure water), and/or a dilute $HNO_3$ solution with concentrations at approximately 2 to 5 wt % $HNO_3$ and balance water.

In accordance with an exemplary embodiment, a standard anodized aluminum study using electrochemical impedance spectroscopy (EIS), an HCl bubble test as disclosed in commonly owned U.S. Patent Publication No. 2008/0241517, and a breakdown voltage measurement on the anodized aluminum test coupons or parts was performed as the baseline. that these three parameters are often key parameters of anodized aluminum. The HCl bubble test measures $H_2$ bubble generation from an HCl solution in a glass tube over the anodized layer. Furthermore, the methodologies as set forth herein can be performed on bare aluminum and/or anodized aluminum surfaces. In accordance with an exemplary embodiment, the steps of the methodology include:

1. Soaking a component of a plasma chamber having a bare nonanodized aluminum and/or anodized aluminum surface (i.e., component) in acetone for approximately 10 minutes;
2. Soaking the component in IPA (Isopropyl Alcohol) for approximately 10 minutes;
3. Spray rinsing the component for approximately 1 minute with UPW (ultra pure water);
4. Soaking the component in a dilute and fresh DSP solution for approximately 5 minutes;
5. Spray rinsing the component for approximately 2 minutes with UPW;
6. Soaking the component in 5 wt % $HNO_3$ solution for approximately 3 minutes;
7. Spray rinsing the component for approximately 2 minutes with UPW;
8. Soaking the component in 5 wt % $HNO_3$ solution for approximately 3 minutes;
9. Spray rinsing the component for approximately 2 minutes with UPW and blow drying using CDA (clean dry air) or nitrogen;
10. Moving the component to a class 1000 cleanroom;
11. Spray rinsing the component for approximately 2 minutes with UPW;
12. Wiping one side of the component with 2 wt % $HNO_3$ for approximately 1 minute;
13. Spray rinsing the component for approximately 2 minutes with UPW;
14. Wiping the other side of the component with 2 wt % $HNO_3$ for approximately 1 minute;
15. Spray rinsing the component for approximately 2 minutes with UPW;
16. Performing an ultrasonic cleaning of the component at 40 kHz at power density as of 8-16 W/inch$^2$ for approximately 10 minutes;
17. Spray rinsing the component for approximately 2 minutes with UPW;
18 Blow drying the component with CDA or nitrogen;
19. Baking the component at 250° F. for approximately 1 hour;
20. Allowing the component to cool; and
21. Packaging the component.

While times as set forth above are preferred, different times can be used including performing any soaking and/or rinsing of the component for various times such as approximately 1 to 5 minutes, and more preferably for approximately 2 to 5 minutes. In addition, the concentration of the $HNO_3$ may vary depending on length of the soaking and/or rinsing times of the component based on the concentration of the nitric acid ($HNO_3$) solution, and wherein the soaking and/or rinsing times for a lower concentration nitric acid ($HNO_3$) will preferably be greater than a higher concentration nitric acid ($HNO_3$).

In accordance with another exemplary embodiment, the soaking and/or rinsing times can include soaking the component in Acetone for 10 to 30 minutes (e.g., step 1), soaking the component in a dilute and fresh (or new) DSP solution for approximately 3 to 10 minutes (e.g., step 4); soaking the component in 5 wt % $HNO_3$ solution for approximately 2 to 5 minutes (e.g., steps 6 and 8); wiping one side of the component with 2 wt % $HNO_3$ for approximately 1 to 2 minutes (e.g., steps 12 and 14); and performing an ultrasonic cleaning of the component at 40 kHz at power density as of 8-16 W/inch$^2$ for approximately 10-20 minutes (e.g., step 17).

In accordance with another exemplary embodiment, the chemical compatibility of anodized aluminum exposed to various dilute $HNO_3$ solutions for 2 hours was studied to determine if any potential impact of the unique property of anodized aluminum during sampling of ICPMS analysis was seen. A 0.2 wt % $HNO_3$ solution can be used for surface contamination analysis of anodized aluminum during the sampling of ICPMS analysis. Accordingly, the anodized samples or parts (i.e., components) were soaked in a dilute $HNO_3$ solution for at least one hour. Then the dilute $HNO_3$ solution was submitted for ICPMS analysis to identify the surface contamination levels of bare aluminum and anodized aluminum.

The chemical compatibility study is summarized in Table 1. In accordance with an exemplary embodiment, the specification of standard Type III anodization on porous layer resistance ($Z_{po}$) and barrier resistance ($R_b$) can be defined as follows: $Z_{po}$ (ohm-cm$_2$)>$1.0 \times 10^6$; and $R_b$ (ohm-cm$^2$)>$1.0 \times 10^8$. As shown in Table 1, for dilute DSP, 5 wt % $HNO_3$, and 0.2 wt % $HNO_3$ solutions, there was no degradation of anodized aluminum on its corrosion resistance in acid, overall impedance, and voltage breakdown cleaning the exposed anodized surface by immersing the anodized surface in the DSP solution for 5 minutes, then in the 5% nitric acid solution for 5 minutes, and then in the 0.2 wt % $HNO_3$ solution for 2 hours.

TABLE 1

Summary of Chemical Compatibility Study of Anodized Aluminum

| Sample Description in Chemical Treatment | EIS Interface Model of Anodized Aluminum | Porous Layer Resistance ($Z_{po}$) in ohm-cm$^2$ | Barrier Layer Resistance ($R_b$) in ohm-cm$^2$ | HCl Bubble Test Time in Minutes | Voltage Breakdown in voltage |
|---|---|---|---|---|---|
| Pre-cleaning (#1, #2, #3) | 2-RC circuit (#1, #2, #3) | #1-4.80 × 10$^6$<br>#2-5.82 × 10$^6$<br>#3-2.34 × 10$^6$ | #1-5.74 × 10$^8$<br>#2-2.68 × 10$^9$<br>#3-2.00 × 10$^9$ | #1 > 120<br>#2 > 120<br>#3 > 120 | #1 > 1200<br>#2 > 1200<br>#3 > 1200 |
| Soak in dilute DSP solution for 5 minutes (5.0 vol % of 98 wt % $H_2SO_4$ + 5.0 vol % of 30% $H_2O_2$ + 90 vol % DIW) | 2-RC circuit (#1, #2) | #1-3.72 × 10$^6$<br>#2-9.75 × 10$^6$ | #1-4.60 × 10$^8$<br>#2-3.17 × 10$^9$ | #1 > 120<br>#2 > 120 | #1 > 1200<br>#2 > 1200 |
| Soak in dilute DSP solution soaking for 5 minutes + soak in 5.0 wt % $HNO_3$ soaking for 5 minutes | 2-RC circuit (#1, #2) | #1-3.47 × 10$^6$<br>#2-9.18 × 10$^6$ | #1-6.07 × 10$^8$<br>#2-3.96 × 10$^9$ | #1 > 120<br>#2 > 120 | #1 > 1200<br>#2 > 1200 |
| Soak in dilute DSP solution for 5 minutes + soak in 5.0 wt % $HNO_3$ for 5 minutes + soak in 0.2 wt % $HNO_3$ soaking for 2 hours | 2-RC circuit (#1) | #1-4.08 × 10$^6$ | #1-5.00 × 10$^8$ | #1 > 120 | #1 > 1200 |

Thus, in accordance with an exemplary embodiment, surface cleanliness on bare aluminum and on anodized aluminum of showerhead electrode backing plates, consistent low levels of metal and mobile ions was achieved. Advantages of the enhanced wet cleaning methods or procedures of anodized aluminum as described herein can include: achieving high cleaning efficiency with lower levels of Na, K, and transition metals; achieving a consistent surface cleanliness due to its high cleaning efficiency; and reducing cleaning material consumption and the usage such as UPW, wipes, labor time, and cleaning cost. In addition, the methods and systems as described herein, reduce and/or eliminate visible degradation on the anodized aluminum surfaces after the enhanced wet chemical cleaning, and provide no detectable degradation on the unique property of the anodized aluminum in its corrosion resistance either in neutral or acidic solutions, on overall impedance spectroscopy, and breakdown voltage performance.

The methods as described herein are applicable to the on-line wet cleaning (decontamination) of anodized aluminum components and/or parts or chamber body itself for a heavily contaminated parts or systems, and achieves a relatively low cost in the enhanced precision wet cleaning, which is applicable to plasma etchers for small feature size applications such as 45 nm, 32 nm and even 25 nm. Thus, in accordance with an exemplary embodiment, the method provides for improved etcher tool production yield by reducing on wafer metal contamination levels.

As set forth above, anodized aluminum due to its unique property and high corrosion resistance has been widely applied as plasma etch chamber components since the 1980s. Anodic films show an excellent corrosion resistance due to its contribution from the nature of the film. It is well known that anodic film contains both a thick porous layer of 50 μm (microns) to 75 μm (microns) and a thin and dense barrier layer of hundreds (100s) of Å (Angstroms) on the underlying aluminum surface. However, thermal treatment either through part manufacturing or through a thermal cycling in plasma etch processing at a relatively high temperature as of 160° C. to 200° C. can cause severe degradation of the corrosion resistance of anodized aluminum.

In addition, it has been shown through the quantitative analysis of electrochemical impedance data, that thermal cycling can cause severe damage and induce large cracks on the anodized aluminum, particularly, on the porous layer of the anodic film. Furthermore, at temperatures up to 160° C. to 200° C., the barrier layer may also be impacted, which can be detected by observing the change of interface model of the overall impedance from a two layer structure to a one layer structure. Thus, the corrosion can occur directly on the underlying aluminum surface after thermal damage through the large cracks in the anodic film. In addition, the acidic corrosion resistance of anodic film can be reduced from hours without thermal treatment to minutes after thermal treatment, which has been determined using HCl bubble time testing.

The degradation of anodic film at high temperatures has been shown to be due to the large differences of the underlying aluminum and anodized aluminum in their coefficients of thermal expansion. For example, an Al6061-T6 alloy has a coefficient of thermal expansion of 23 ppm per degree. However, an anodized aluminum film, the coefficient of thermal expansion is only 10 ppm per degree. Thus, the thermal expansion of aluminum is at least twice that of anodized aluminum film. Accordingly, when anodized aluminum is thermally cycled between room temperature and 120° C. for 50 cycles, the overall impedance can still hold a three-time constant interface model. The degradation of barrier layer resistance is limited and the porous layer shows a two-layered structure. Furthermore, the first porous layer resistance is much lower than that of the anodized aluminum without thermal treatment, but the second porous layer resistance only has limited decrease away from the original porous layer resistance. Accordingly, anodized aluminum at or below 120° C., the corrosion resistance of the porous layer is impacted. Meanwhile, the corrosion resistance of barrier has little impact. On the other hand, when thermal cycling is at 160° C. or higher, both porous and barrier layers degrade, such that anodized aluminum is exposed to a high temperature treatment such as at 160° C. or higher, bare aluminum will have a much large expansion in comparison with the anodized aluminum film. Thus, the anodic film has no choice to suffer severe micro-cracks in order to match the large expansion of the bare aluminum under the anodic film. In addition, as the temperature goes higher, the crack density of the anodic film becomes larger.

The thermal cycling during etch processing at a relatively high temperature can also cause the degradation of the corrosion resistance of anodized aluminum films at 120° C. or higher. The thermal cycle can be one-cycle or as multi-cycles. At 120° C., the degradation of the anodic film is limited to the porous layer, but at 160° C. or higher, the degradation of anodic film affects both the porous layer and the barrier layer. In addition, micro-cracks throughout the entire anodic film can cause direct corrosion of underlying aluminum through the micro-cracks.

It would be desirable to have a method to improve the corrosion resistance of anodized aluminum after thermal treatment or thermal damage, which meets the critical properties of anodized aluminum, and modifying the manufacture processes to avoid post anodization vulcanization. In accordance with an exemplary embodiment, the corrosion resistance of the anodized aluminum component can be restored following the cleaning of the components set forth above by performing a hot deionized water (DIW) seal on the anodized aluminum component.

In an exemplary embodiment, a thermal treatment of an anodized aluminum rocker door was performed through one cycle thermal treatment in post anodization vulcanization at 193° C. and 204° C., respectively. After completion of the thermal treatment, the corrosion resistance was studied and key parameters of anodized aluminum after post anodization vulcanization were obtained, which include: (1) electrochemical impedance spectroscopy (EIS); (2) acidic corrosion resistance of anodized aluminum in 5.0 wt % HCl solutions; and (3) voltage breakdown of the anodic film (optional).

In accordance with an exemplary embodiment, two methodologies to enhance the corrosion resistance of the anodization were developed. If the time of the study and wet cleaning of anodized parts are controlled within (or less than) 24 hours, a post DIW seal can be performed to enhance the corrosion resistance by placing the component in a hot DIW tank at 98° C. to 100° C. with a controlled pH value and performing (or carrying on) the hot DIW seal, wherein for anodized aluminum with a 2.0 mils thickness, the hot DIW sealing time is approximately 150 minutes, and for anodized aluminum with a 3.0 mils thickness, the hot DIW sealing time is approximately 225 minutes. In addition, for anodized aluminum components having thicknesses other than as set forth herein, the corresponding hot DIW sealing times are adjusted accordingly.

Alternatively, if the time after thermal treatment is over (or greater than) 24 hours, an anodization process needs to be performed, which includes placing the component in the anodization tank and carry on the anodization through the ending voltage. One can use either a standard Type III anodization procedure or a mixed acid anodization to end at high voltage. The anodization process helps to enhance the corrosion resistance of the anodization layer with large cracks. After anodization and post cleaning, the component is placed in a hot DIW tank at 98° C. to 100° C. with a controlled pH value and performing (or carrying on) the hot DIW seal as set forth above, wherein for anodized aluminum with a 2.0 mils thickness, the hot DIW sealing time is approximately 150 minutes, and for anodized aluminum with a 3.0 mils thickness, the hot DIW sealing time is approximately 225 minutes. The time of the hot DIW seal is preferably strictly followed at the anodization supplier's site. Once the final precision wet cleaning after the hot DIW seal is performed, the assembly or anodized aluminum component can be packed in a class 1000 cleanroom.

The method for anodized aluminum was carried out on a rocker valve door, which was subject to thermal treatment at 193° C. and 204° C., respectively. The results showed that the HCl (hydrogen chloride) bubble time on the front rocker valve door was about 5 minutes on the roughened anodized surface. EIS interface model showed a one-time constant model indicating the direct corrosion on the bare aluminum surfaces through cracks in the anodic film. After the hot DIW seal, EIS showed a standard two-time constant model with both high porous layer and barrier layer resistances, which indicates that the hot DIW seal can refill the micro-cracks generated during thermal treatment and that the anodic film can achieve an improved corrosion resistance due to the corrosion protection of both porous and barrier layers of the anodic film. Furthermore, the test results showed that the HCl bubble time improved from 5 minutes for a thermally damaged door to 70 minutes on the roughened anodized surface (plasma side).

The hot DIW sealed component after thermal cycling or thermal damage preferably meets the critical properties of anodized aluminum, wherein the basic properties are as follows:

1. The overall impedance model of anodized aluminum should show a two-time constant interface model with both porous layer and barrier layer contributions to the overall impedance on the roughened anodized surface of the component;

2. The porous layer corrosion resistance should be equal or larger than $1.0 \times 10^6$ ohm-cm$^2$, and wherein the barrier layer resistance should be equal or larger than $2.0 \times 10^8$ ohm-cm$^2$ on the roughened anodized surface of the component; and 3. The HCl bubble time of the component should be longer than 60 minutes on the roughened anodized surface of the component.

For example, a component, which had only 5 minutes in HCl bubble time and a one-time constant interface model in its overall impedance after only one cycle thermal treatment, achieved 70 minutes in HCl bubble time and a two-time constant model of overall impedance after the hot DIW seal. In addition, the porous layer corrosion resistance increased to $2.20 \times 10^6$ ohm-cm$^2$ and the barrier layer resistance reached $1.49 \times 10^9$ ohm-cm$^2$.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. A method of cleaning an aluminum or anodized aluminum surface of a component of a plasma chamber in which semiconductor substrates are processed, the method comprising:
   soaking the surface in a diluted sulfuric peroxide (DSP) solution;
   spray rinsing the surface with water following removal of the surface from the DSP solution;
   soaking the surface in a dilute nitric acid (HNO3) solution having a concentration of approximately 2 to 5 wt % HNO3 and a balance water;
   spray rinsing the surface with water following removal of the surface from the nitric acid solution; and
   repeating at least twice the steps of soaking the surface in dilute nitric acid and spray rinsing the surface with water following removal of the surface from the DSP solution.

2. The method of claim 1, further comprising performing the following steps before soaking the surface in the diluted sulfuric peroxide (DSP) solution:
   soaking the surface in acetone;
   soaking the surface in isopropyl alcohol (IPA) following removal of the surface from the acetone; and
   spray rinsing the surface with water (Ultra Pure Water) following removal of the surface from IPA.

3. The method of claim 1, further comprising performing an ultrasonic cleaning on the surface after repeating at least twice the steps of soaking the surface in nitric acid followed by spray rinsing the surface.

4. The method of claim 3, further comprising spray rinsing and blow drying the surface following ultrasonic cleaning using clean dry air (CDA) or nitrogen.

5. The method of claim 4, further comprising baking the surface following the spray rinsing and blow drying of the surface.

6. The method of claim 3, wherein the step of performing an ultrasonic cleaning of the surface comprises cleaning the component at 40 kHz at power density as of 8-16 W/inch$^2$ for approximately 10 to 20 minutes.

7. The method of claim 1, wherein the DSP solution comprises approximately 5.0 vol % of a 98 wt % $H_2SO_4$ solution, 5.0 vol % of a 30% $H_2O_2$ solution, and 90 vol % ultra pure water (UPW).

8. The method of claim 1, further comprising performing the steps of repeating at least twice the steps of soaking the surface in dilute nitric acid and spray rinsing the surface with water following removal of the surface from the DSP solution using at least two different dilute nitric acid solutions.

9. The method of claim 1, wherein the step of soaking the surface in a diluted sulfuric peroxide (DSP) solution is performed for approximately 5 minutes.

10. The method of claim 1, wherein the step of soaking the surface in a $HNO_3$ solution further comprises soaking the surface in approximately 5 wt % $HNO_3$ solution for approximately 5 minutes.

11. The method of claim 1, wherein the surface is an anodized aluminum surface, and further comprising performing a hot deionized water (DIW) seal on the anodized aluminum surface following the cleaning of the surface.

12. The method of claim 11, further comprising:
   removing the anodized aluminum surface from the chamber after plasma processing semiconductor substrates in the chamber; and
   performing the hot DIW seal on the anodized aluminum surface following the cleaning of the anodized aluminum surface.

13. The method of claim 12, further comprising performing the hot DIW seal on the anodized aluminum surface within approximately 24 hours of the plasma processing.

14. The method of claim 12, wherein the hot deionized water seal further comprises placing the anodized aluminum surface in a hot DIW tank at approximately 98° C. to approximately 100° C. with pH value of between approximately 5.7 and approximately 6.2.

15. The method of claim 12, further comprising performing the hot DIW seal for approximately 150 minutes for a surface having an anodized layer thickness of approximately 2.0 mils or performing the hot DIW seal for approximately 225 minutes for a surface having an anodized layer thickness of approximately 3.0 mils.

16. The method of claim 12, further comprising performing a precision wet cleaning after the hot DIW seal.

17. A method of cleaning an aluminum or anodized aluminum surface of a component of a plasma chamber in which semiconductor substrates are processed, the method comprising:
   soaking the surface in a diluted sulfuric peroxide (DSP) solution;
   spray rinsing the surface with water following removal of the surface from the DSP solution;
   soaking the surface in a dilute nitric acid ($HNO_3$) solution;
   spray rinsing the surface with water following removal of the surface from the nitric acid solution; and
   repeating at least twice the steps of soaking the surface in dilute nitric acid and spray rinsing the surface with water following removal of the surface from the DSP solution; and
   wiping the surface with a dilute nitric acid wipe following soaking of the surface in a dilute nitric acid solution, and wherein the dilute nitric acid wipe is performed using a wipe dipped in a solution which has a concentration of approximately 2 wt % $HNO_3$ and balance water, and the dilute nitric acid solution has a concentration of approximately 5 wt % $HNO_3$ and balance water.

18. The method of claim 17, wherein the step of soaking the surface in the approximately 5 wt % $HNO_3$ solution is performed for approximately 2 to 5 minutes.

19. A method of cleaning an anodized surface of a component of a plasma chamber in which semiconductor substrates are processed, the method comprising:
   soaking the surface in a diluted sulfuric peroxide (DSP) solution;
   spray rinsing the surface with water following removal of the surface from the DSP solution;
   soaking the surface in approximately 5 wt % dilute nitric acid ($HNO_3$) solution for approximately 5 minutes;
   spray rinsing the surface with water following removal of the surface from the nitric acid solution;
   repeating at least twice the steps of soaking the surface in dilute nitric acid and spray rinsing the surface with water following removal of the surface from the DSP solution; and
   soaking the surface in approximately 0.2 wt % $HNO_3$ for approximately 2 hours followed by evaluating corrosion resistance of the anodized surface with an HCl bubble test.

* * * * *